United States Patent [19]
Hisada et al.

[11] Patent Number: 5,049,918
[45] Date of Patent: Sep. 17, 1991

[54] COLOR IMAGE RECORDING APPARATUS

[75] Inventors: Hidenori Hisada, Tokoname; Makoto Suzuki, Nagoya; Hiroshi Taira, Kasugai, all of Japan

[73] Assignee: Brother Kogyo Kabushiki Kaisha, Aichi, Japan

[21] Appl. No.: 397,832

[22] Filed: Aug. 24, 1989

[30] Foreign Application Priority Data

| Aug. 25, 1988 | [JP] | Japan | 63-210987 |
| Aug. 27, 1988 | [JP] | Japan | 63-213406 |
| Oct. 21, 1988 | [JP] | Japan | 63-265635 |
| Oct. 21, 1988 | [JP] | Japan | 63-265636 |

[51] Int. Cl.$^5$ .............................. G03B 27/32
[52] U.S. Cl. ..................... 355/27; 355/35; 355/30; 355/69
[58] Field of Search ............ 355/27, 28, 32, 30, 355/35, 83, 38, 68, 69, 285; 219/216; 430/138

[56] References Cited

U.S. PATENT DOCUMENTS

| 3,679,306 | 7/1972 | Du Bois et al. | 355/68 |
| 3,709,613 | 1/1973 | Zahn et al. | 355/68 X |
| 4,113,375 | 9/1978 | Murata et al. | 355/285 |
| 4,354,758 | 10/1982 | Futaki | 355/69 X |
| 4,540,279 | 9/1985 | Irie et al. | 355/69 |
| 4,875,074 | 10/1989 | Sangyoji et al. | 355/27 |

Primary Examiner—Brian W. Brown
Assistant Examiner—Khahn Dang
Attorney, Agent, or Firm—Oliff & Berridge

[57] ABSTRACT

An image recording apparatus for recording an image orresponding to an image corresponding to an original image on a photosensitive recording medium. This apparatus uses at least one mask member having a surface on which a light shielding image corresponding to the original image. In order to reproduce a clear image, various factors which may cause to change the amount of exposure are compensated for. Such factors includes the thickness of the paper of the mask member, the paper quality of the mask member, the condition of a laser printer which prints the light shielding image on the mask member.

21 Claims, 11 Drawing Sheets

| POWER SUPPLY (V) | FIRING ANGLE (θ) | POWER SUPPLY (V) | FIRING ANGLE (θ) |
|---|---|---|---|
| 80 | 38 | 101 | 73 |
| 81 | 40 | 102 | 74 |
| 82 | 42 | 103 | 75 |
| 83 | 44 | 104 | 77 |
| 84 | 46 | 105 | 78 |
| 85 | 48 | 106 | 79 |
| 86 | 50 | 107 | 80 |
| 87 | 52 | 108 | 81 |
| 88 | 54 | 109 | 83 |
| 89 | 56 | 110 | 84 |
| 90 | 57 | 111 | 85 |
| 91 | 59 | 112 | 86 |
| 92 | 60 | 113 | 87 |
| 93 | 62 | 114 | 88 |
| 94 | 63 | 115 | 89 |
| 95 | 65 | 116 | 90 |
| 96 | 66 | 117 | 91 |
| 97 | 67 | 118 | 93 |
| 98 | 69 | 119 | 94 |
| 99 | 70 | 120 | 95 |
| 100 | 71 | | |

COLOR IMAGE RECORDING APPARATUS

BACKGROUND OF THE INVENTION

The present invention relates to a color image recording apparatus for recording a color image on a photosensitive recording medium.

One conventional method for recording a colored image on a color photosensitive recording medium employs color separation filters of red (R), green (G) and blue (B) for producing color-separated mask members from an original color image. The photosensitive sheet is exposed to light successively through these mask members. There is also known a process for applying white light directly to a color original image and exposing a photosensitive sheet to light reflected by the colored original image. The former color image recording method is more efficient than the latter process in that the intensity of exposure energy required to be applied to the photosensitive recording medium by the former method is much smaller than that required by the latter process.

In the recording apparatus of the type described above, it is necessary to apply a predetermined amount of light to the photosensitive recording medium through the mask members in order to reproduce a clear image. However, the amount of light emitted from the exposure lamp varies caused by various factors. Such factors include the paper thickness of the mask member, the paper quality of the mask member, the density of the light shielding image formed by a monochromatic laser printer on the mask member. Further, the amount of exposure changes depending upon the variation of the power supply voltage connected to the exposure lamp. In addition, with the arrangement in which a heat generating element contained in a thermal fixing unit is connected to the common power supply voltage to which the exposure lamp is connected, the amount of exposure also changes depending upon the variation of the voltage in the power supply in which the power supply voltage may be changed by the temperature of the heat generating element.

SUMMARY OF THE INVENTION

In view of the aforesaid short-coming of the image recording apparatus, it is an object of the present invention to provide an image recording apparatus in which a clear image can be reproduced independently of the paper quality and the paper thickness of the mask member.

Another object of the invention is to provide an image recording apparatus in which a clear image can be reproduced independently of the condition of a laser printer producing the mask member.

Still another object of the invention is to provide an image recording apparatus in which an amount of exposure can be controlled.

A further object of the invention is to provide an image recording apparatus in which a voltage applied to an exposure lamp is controlled to thereby control the amount of light emitted from the exposure lamp.

The above and other objects of the invention can be achieved by the image recording apparatus for recording on a photosensitive recording medium an image corresponding to an original image using at least one mask member having a surface on which a light shielding image corresponding to the original image is formed with a light shielding material, wherein the mask member coated with the light shielding material has a first light transmission rate and the mask member with no light shielding material has a second light transmission rate, which comprises exposure means for exposing the photosensitive recording medium to light through the mask member to form a latent image corresponding to the light shielding image on the photosensitive recording medium, the exposure means including an exposure lamp for emitting a light, developing means for developing the latent image formed on the photosensitive recording medium to provide a visible image, fixing means for thermally fixing the visible image, the fixing means including a heat generating element, first detecting means for detecting the first light transmission rate and producing a first signal indicative of the first light transmission rate, second detecting means for detecting the second light transmission rate and producing a second signal indicative of the second light transmission rate, control means responsive to both the first signal and the second signal for controlling an amount of light applied to the photosensitive recording medium by the exposure means.

According to another aspect of the invention, there is provided an image recording apparatus for recording an image on a photosensitive recording medium, comprising exposure means for exposing the photosensitive recording medium to light to form a latent image thereon, the exposure means including an exposure lamp for emitting a light, developing means for developing the latent image formed on the photosensitive recording medium to provide a visible image, fixing means for thermally fixing the visible image, the fixing means including a heat generating element, first detecting means for detecting an intensity of the light emitted from the exposure lamp and producing a first signal indicative of the intensity of the light, and control means responsive to the signal produced from the detecting means for controlling the intensity of the light emitted from the exposure lamp.

According to a further aspect of the invention, there is provided an image recording apparatus for recording an image on a photosensitive recording medium, comprising exposure means for exposing the photosensitive recording medium to light to form a latent image thereon, the exposure means including an exposure lamp for emitting a light, developing means for developing the latent image formed on the photosensitive recording medium to provide a visible image, fixing means for thermally fixing the visible image, the fixing means including a heat generating element, first detecting means for detecting an amount of light emitted from the exposure lamp and producing a first signal indicative of the amount of light, and control means responsive to the first signal produced from the first detecting means for controlling a period of time during which the exposure lamp emits the light.

According to a still further aspect of the invention, there is provided an image recording apparatus for recording an image on a photosensitive recording medium, comprising an AC power supply, exposure means for exposing the photosensitive recording medium to light to form a latent image thereon, the exposure means including an exposure lamp connected to the AC power supply, developing means for developing the latent image formed on the photosensitive recording medium to provide a visible image, fixing means for thermally fixing the visible image, the fixing means including a heat generating element connected to the AC power supply for generating heat, first switching means interposed between the AC power supply and the exposure lamp for on/off switching the connection of the exposure lamp to the AC power supply, second switching means interposed between the AC power supply and the heat generating element for on/off switching the connection of the heat generating element to the AC power supply, temperature sensing means for sensing a temperature of the heat generating element and outputting a signal indicative of the sensed temperature, control means connected to the temperature sensing means for controlling the switchings of the second switching means in response to the signal indicative of the sensed temperature.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

Color image recording apparatus according to the present invention uses a transfer type image recording medium as disclosed, for example, in U.S. Pat. No. 4,399,209 to Sanders et al. Briefly, this recording medium has a substrate on which an immense number of microcapsules are coated (hereinafter this recording medium will be referred to as "microcapsule-coated sheet"). The microcapsules separately encapsulate a photo polymerization initiator, a photo-curing resin and a chromogenic material of one of three primary colors, i.e. cyan, magenta and yellow. Details of the photo polymerization initiator is disclosed in the Japanese Laid-Open Patent Publication No. 62-143044. With the aid of the photo polymerization initiator, the photo-curing resin is photo-cured when it is irradiated with a light having a wavelength corresponding to red, green or blue. There is a separate image receiving sheet having a surface coated with a developer material (hereinafter this sheet will be referred to as "developer sheet"). When the microcapsule-coated sheet is exposed to light, the microcapsules in the exposed area are photo-cured to thereby form a latent image thereon corresponding to the pattern of the exposure. The microcapsule-coated sheet and the developer sheet are superposed one on the other and pressure is applied thereto so that the latent image on the microcapsule-coated sheet may be developed. Then, the unexposed microcapsules is ruptured and the chromogenic material is released from the ruptured microcapsules which reacts with the developer material, whereby a visible image is formed on the developer sheet.

Image recording apparatuses will be described with reference to FIGS. 1 and 2.

Figure 1:
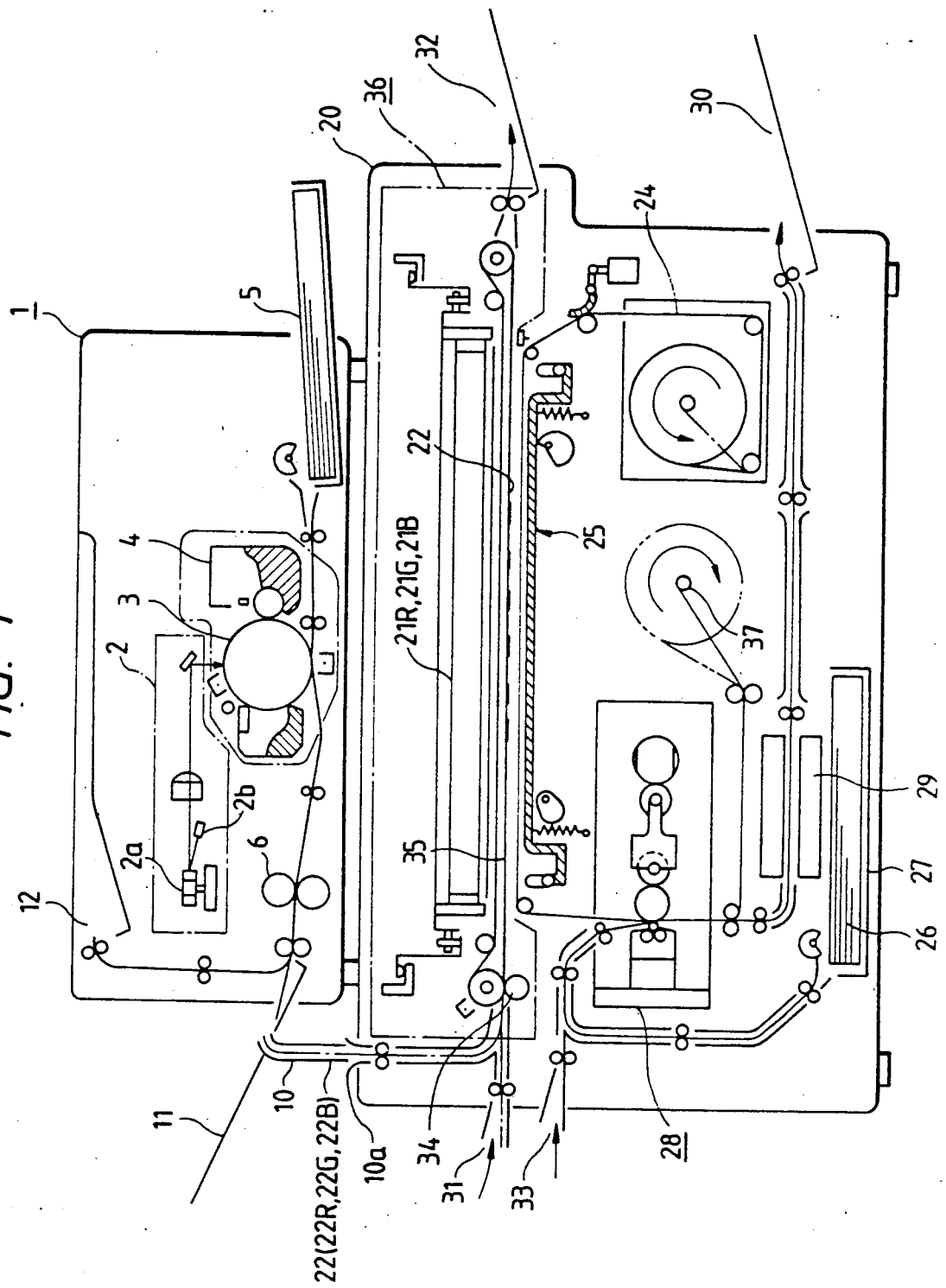
FIG. 1 is a schematic vertical cross-sectional view showing a color image recording apparatus according to the present invention.

Referring first to FIG. 1, the apparatus shown therein includes a laser printer 1 and a color image forming apparatus 20. The laser printer 1 includes an optical unit 2, a photosensitive drum 3, a developing unit 4 and a fixing unit 6. The optical unit 2 includes a polygon scanner 2a to which a laser beam is incident. The laser beam incident to the polygon scanner 2a is oscillated from a laser oscillator 2b in accordance with color image information corresponding to each of red, green and blue of an original image. Such color image information is supplied from a host computer (not shown). The laser beam reflected on one facet of the polygon scanner 2a is applied to the precharged photosensitive drum 3 to thereby form a latent image thereon corresponding to one of red, green and blue colors. The latent image formed on the photosensitive drum 3 is developed in the developing unit 4 to provide a visible toner image. The toner image is transferred onto a plain paper or OHP (overhead projector) film supplied from a sheet cassette 5, and then is fixed in the fixing unit 6. By the laser printer 1, three mask members 22R, 22G and 22B are successively produced corresponding to the three primary colors, i.e., red, green and blue, of the original image, respectively. Specifically, the mask members 22R, 22G and 22B have light shielding images thereon corresponding to patterns of the three primary colors of the original image. Such mask members are used to reproduce the original color image.

When a monochromatic (black-and-white) image is required, an output image sheet from the laser printer 1 is discharged onto a tray 11 or 12. When a color image is desired, an output image sheet serving as a mask member is fed into the color image forming apparatus 20 through a sheet guide 10.

The color image forming apparatus 20 shown in FIG. 1 records a color image with the use of the mask members produced by the laser printer 1. The color image forming apparatus 20 has a mount 10a on which the sheet guide 10 is detachably mounted for supplying the mask members 22 (22R, 22G, 22B) into an exposure unit 36, an exposure table 26 on which the mask member 22 is brought into facial contact with a microcapsule-coated sheet 24, exposure lamps 21R, 21G, 21B of three primary colors, a cassette 27 for storing a stack of developer sheets 26 each coated with a color developer material which reacts with a chromogenic material or a dye precursor encapsulated in microcapsules coated on the sheet 24, a pressure developing unit 28 for pressing the developer sheet 26 and the microcapsule-coated sheet 24 held in superposed relation to rupture the microcapsules which have not been photocured, thereby providing a color image on the developer sheet 26, a thermal fixing unit 29 for promoting color development, a sheet discharge tray 30, a manual insertion tray 31 for allowing the mask member 22 to be manually inserted into the apparatus 20, a mask discharge tray 32 onto which the used mask members 22 are discharged, and a manual insertion tray 33 for allowing the developer sheet 26 to be manually inserted into the apparatus 20.

In a color mode, the mask member 22R corresponding to the red image pattern of the original image is passed through the sheet guide 10 and fed into a nip between rollers 34 by which the leading end of the mask member 22R is positioned. The mask member 22R is electrostatically attached to a transparent endless conveyor belt 35 made of an insulating material, such as polyethylene terephthalate (PET). The endless conveyor belt 35 is suspended between spaced-apart rollers and electric charges are applied to the surface of the conveyor belt 35 by an electrostatic charge generator, such as a corotron. Then, the mask member 22R is introduced into the exposure area. In the exposure area, the mask member 22R and the microcapsule-coated sheet 24 are held in facial contact with each other on the exposure table 25, and the microcapsule-coated sheet 24 is exposed to light emitted from the exposure lamp 21R through the mask member 22R, thereby producing a latent image corresponding to the light shielding pattern of the mask member 22R on the microcapsule-coated sheet 24. After the exposure is ended, the mask member 22R is discharged onto the tray 32. The same process is also carried out successively with respect to the mask members 22G, 22B corresponding respectively to the green and blue image patterns of the original image to superposedly form green and blue latent images on the microcapsule-coated sheet 24. The exposed microcapsule-coated sheet 24 is then superposed on the developer sheet 26, and the superposed latent images are developed into a visible color image in the pressure developing unit 28. The developer sheet 26 is then passed through the thermal fixing unit 29 and discharged onto the tray 30. The used microcapsule-coated sheet 24 is wound up by a takeup roll 37.

When the mask members 22R, 22G, 22B are produced in the laser printer 1, a communication is made between the image forming apparatus 20 and the laser printer 1 so that the operation in the apparatus 20 may be carried out in synchronism with the production of the mask members. If the operation in the image forming apparatus 20 is asynchronous with the operation in the laser printer, the next mask member would be introduced into the apparatus 20 before exposure of the previous mask member is completed. Even if such synchronization is achieved, however, the laser printer 1 may not be available for another purpose during reproduction of the color image, since the output from the laser printer 1 is queued. To avoid this problem, the processing time in the image forming apparatus 20 is made shorter than the output time in the laser printer 1 so that the mask members produced by the laser printer 1 can be accepted by the apparatus 20 at any time, with the result that no communication is required between the laser printer 1 and the image forming apparatus 20. A high-speed laser printer can be interfaced with the image forming apparatus 20 by employing a buffer for the mask members.

Figure 2:
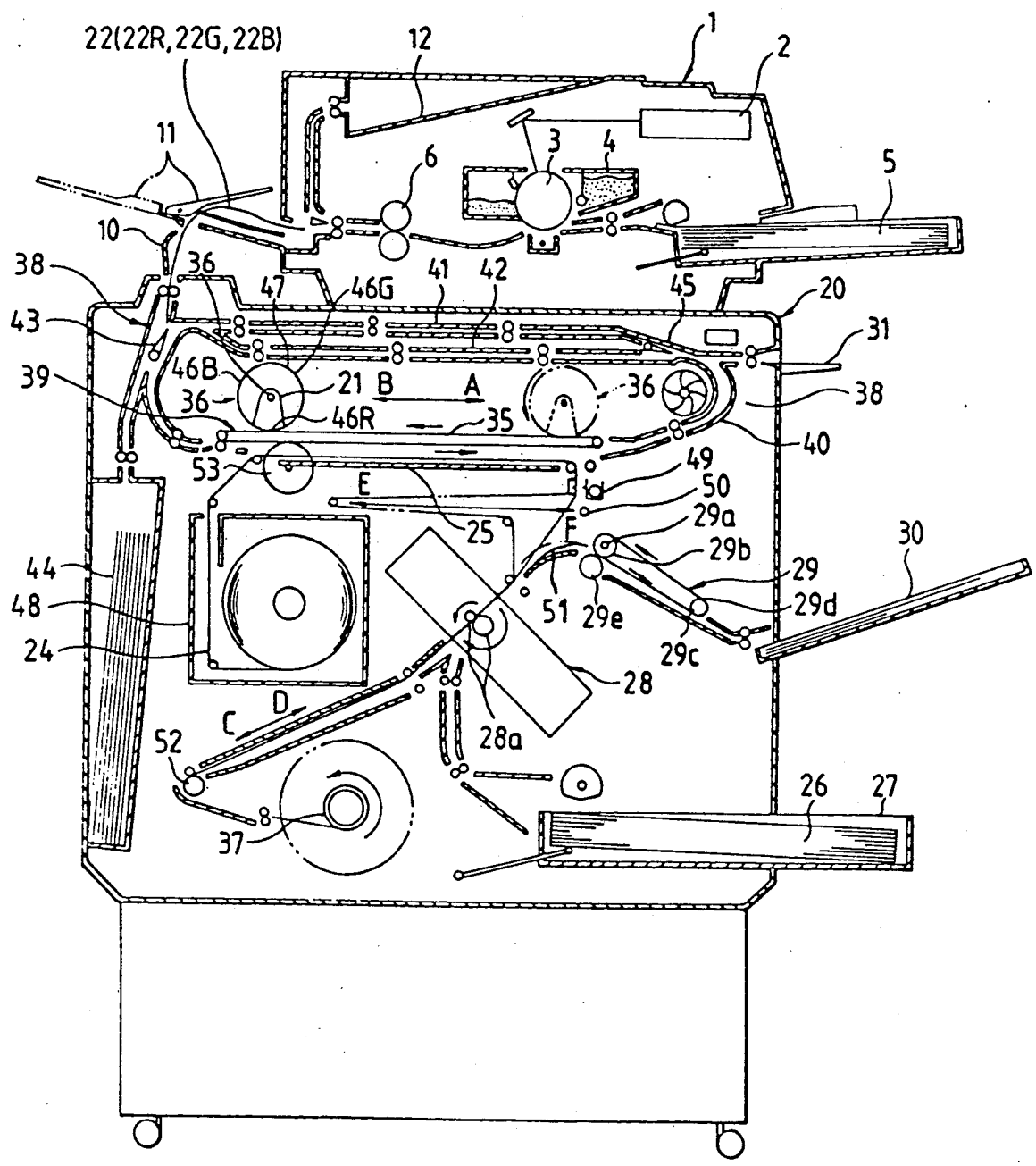
FIG. 2 is a schematic vertical cross-sectional view showing another color image recording apparatus according to the present invention.

FIG. 2 shows a modified color image recording apparatus 20 of the apparatus shown in FIG. 1. The same or similar components or elements as those shown in FIG. 1 are denoted by the same or similar reference numerals in FIG. 2, and duplicate description is omitted herein. Only the components or arrangements which differ from those of the apparatus in FIG. 1 will be described.

The laser printer 1 has a discharge tray 11, the distal end of which is angularly movable between solid line position and a chain line position as shown. When it is in the solid-line position, the output image sheet from the laser printer 1 is guided into the color forming recording apparatus 20.

The color image forming apparatus 20 has a mask member feeder 38 in its upper portion. The mask member feeder 38 includes a positioning unit 39, a circulation guide 40, and two parallel upper and lower storage trays 41, 42, which are coupled in a circulatory fashion. The junction between the positioning unit 39 and the storage trays 41, 42 is connected to the discharge tray 11 of the laser printer 1 through a sheet guide 10, so that the output image sheet is introduced into the mask member feeder 38.

The mask member feeder 38 includes a swingable gate 43 for selectively directing the mask member 22, which has been guided by the sheet guide 10, toward the positioning unit 39 or a discharge tray 44. Further, a swingable gate 45 is disposed between the circulation guide 40 and the storage trays 41, 42. The gate 45 directs the mask member 22, which has been guided by the circulation guide 40, into the upper storage tray 41 or the lower storage tray 42. The mask member 22 which has been inserted from a manual insertion tray 31 can be introduced into the mask member feeder 38. The mask member feeder 38 has a plurality of pairs of sheet feed rollers.

An exposure unit 36 is disposed above the positioning unit 39. The exposure unit 36 is movable horizontally along the positioning unit 39.

Color separation filters 46R, 46G, 46B are disposed around an exposure lamp 21 and the reflecting member 47, and are successively brought into the position below the exposure lamp 21 in accordance with the movement of the exposure unit 36 itself over its stroke.

The microcapsule-coated sheet 24 is housed in a cartridge 48 in a light shielded condition. The microcapsule-coated sheet 24 which is drawn out of the cartridge 48 passes between the belt 35 and an exposure table 25, goes past a fastening roller 49, a tension roller 50, a movable guide 51, a pressure developing unit 28, and a drive roller 52, and is wound around a takeup roller 37. When the microcapsule-coated sheet 24 is exposed to light from the exposure unit 36, the exposure table 25 is elevated by a cam 53 to bring the microcapsule-coated sheet 24 into close contact with the mask member 22 which has been fed by the conveyor belt 35. While an image is being developed by the pressure developing unit 28, the microcapsule-coated sheet 24 is gripped and fastened in position by the fastening roller 49, and is also prevented from sagging by the tension roller 50. The drive roller 52 serves to feed the microcapsule-coated sheet 24 at a constant speed.

A thermal fixing unit 29 comprises a heat roller 29b with a heater 29a disposed therein, an auxiliary roller 29c, an endless belt 29d trained around the heat roller 29b and the auxiliary roller 29c, and a pinch roller 29e pressed against the heat roller 29b through the endless belt 29d therebetween. A developer sheet 26 which has been fed from the pressure developing unit 28 and guided by the movable guide 51 is introduced into the thermal fixing unit 29 in which the developer sheet 26 is calendered to fix the visualized image. The developer sheet 26 is then discharged from the thermal fixing unit 29 onto a discharge tray 30.

The color image forming apparatus 20 thus constructed operates as follows.

It is assumed that a red mask member 22R is produced by the laser printer 1. The mask member 22R has a toner pattern thereon as a light-shielding image, and light passing through the mask member 22R except its light-shielding image photo-cures those microcapsules which contain a dye precursor of cyan on the microcapsule-coated sheet 24.

At this time, the discharge tray 11 of the laser printer 1 is in the solid-line position. The produced mask member 22R is guided by the guide member 10 into the mask member feeder 38 in the color image forming apparatus 20.

When the mask member 22R is brought to a proper position, the microcapsule-coated sheet 24 is fastened by the fastening roller 49, and the cam 53 is rotated by an actuator (not shown) to elevate the exposure table 25. The microcapsule-coated sheet 24 is now held intimately against the conveyor belt 35 of the positioning unit 39 with the mask member 22R sandwiched therebetween.

When the exposure table 25 is in close contact with the positioning unit 39, the exposure lamp 21 is turned ON, and red light is applied from the red filter 46R through the mask member 22R to the microcapsule-coated sheet 24 while at the same time it is being scanned by the exposure unit 36 in the direction indicated by an arrow A, until the exposure unit 36 reaches the rightmost position. After the exposure, the lamp 21 is deenergized, and the exposure unit 36 moves back toward the leftmost position in the direction indiated by an arrow B. While the exposure unit 36 is moving back, the exposure table 25 is lowered by the cam 53 so that the microcapsule-coated sheet 24 is spaced downwardly from the positioning unit 39 and the mask member 22R.

At this time, the microcapsule-coated sheet 24 is held under back tension by the shaft in its roll in the cartridge 48. When the exposure table 25 is lifted, the length of the microcapsule-coated sheet 24 which corresponds to the upward displacement of the exposure table 25 is drawn out of the cartridge 48. When the exposure table 25 is lowered after exposure, the length of the microcapsule-coated sheet 24 which corresponds to the downward displacement of the exposure table 25 is withdrawn into the cartridge 48, thereby taking up any sag in the microcapsule-coated sheet 24.

After the exposure using the red mask member 22R is completed and the descent of the exposure table 25 is confirmed, the conveyor belt 35 of the positioning unit 39 is moved to deliver the mask member 22R into the circulation guide 40, from which the red mask member 22R is guided by the gate 45 into the upper storage tray 41.

Then, the green mask member 22G generated by the laser printer 1 passes through the sheet guide 10, and is guided by the gate 43 into the positioning unit 39 in which the green mask member 22G is positioned with respect to the microcapsule-coated sheet 24.

If the filter in the operative position of the exposure unit 36 does not correspond to the green mask member 22G at this time, then the exposure unit 36 is operated until the proper filter 46G is positioned below the lamp 21.

Then, the exposure table 25 is elevated to hold the microcapsule-coated sheet 24 and the green mask member 22G closely against the conveyor belt 35, and then the lamp 21 is energized to expose the microcapsule-coated sheet 24 to green light from the green filter 46G. Following the exposure, the exposure table 25 descends, and the green mask member 22G is guided through the circulation guide 40 and introduced by the gate 45 into the lower storage tray 42. The exposure unit 36 moves back, and the blue filter 46B is positioned below the lamp 21.

The blue mask member 22B generated by the laser printer 1 is then delivered by the mask member feeder 38 and positioned by the positioning unit 39. Thereafter, the microcapsule-coated sheet 24 is exposed to blue light by the exposure unit 36. Through the above process, a desired color latent image is formed on the microcapsule-coated sheet 24.

Then, the exposure table 25 is lowered and the fastening roller 49 is released from the microcapsule-coated sheet 24, which is then fed by the drive roller 52 in the direction indicated by an arrow C. At this time, the tension roller 50 and the movable guide 51 are in the solid line position. Pressure rollers 28a of the pressure developing unit 28 are spaced from each other. Therefore, while the microcapsule-coated sheet 24 is being fed and wound up by the takeup roller 37, the microcapsules on the microcapsule-coated sheet 24 are not damaged or ruptured by contact with these components. The drive roller 52 is stopped when the trailing end of the latent image on the microcapsule-coated sheet 24 arrives at the pressure roller 28a of the pressure developing unit 28.

In synchronism with the movement of the microcapsule-coated sheet 24, the developer sheet 26 is delivered from the cassette 27 by the sheet feed roller. The developer sheet 26 from the cassette 27 is stopped when its leading edge faces the trailing end of the latent image on the microcapsule-coated sheet 24.

The pressure rollers 28a of the pressure developing unit 28 are then rotated and held against each other by an actuator (not shown), and the microcapsule-coated sheet 24 is gripped and fastened by the fastening roller 49. The microcapsule-coated sheet 24 and the developer sheet 26 which are held in superposed relation to each other are pressed and red in the direction indicated by an arrow D. At this time, those microcapsules which are not photo-cured on the microcapsule-coated sheet 24 are ruptured under pressure, and a color visible image corresponding to the latent image on the microcapsule-coated sheet 24 is developed on the developer sheet 26.

As the pressure roller 28a rotate in the directions indicated by the arrows, the tension roller 50 is moved in the direction indicated by an arrow E, taking up any sag in the microcapsule-coated sheet 24. While the tension roller 50 moves in the direction indicated by the arrow E, the movable guide 51 is moved by a mechanism (not shown) into the broken-line position to separate the leading edge of the developer sheet 26 from the microcapsule-coated sheet 24, and guide the developer sheet 26 toward the thermal fixing unit 29.

In the thermal fixing unit 29, heat energy is applied to the developer sheet 26 by the heater 29 through the rotating heat roller 29b and the endless belt 29d to promote color development of the colored image. At the same time, a binder polymer is thermally fused on the developer sheet 26 for securing the color developers to the base sheet. The developer sheet 26 is now calendered to the same smoothness as that of the surface of the endless belt 29d, so that the developer sheet 26 has a suitable glossy surface.

After the color developing and calendering process, the developer sheet 26 is separated from the endless belt 29d through a curved path, and discharged onto the discharge tray 30.

During the image developing process and the color developing and calendering process described above, the microcapsule-coated sheet 24 is gripped and fastened in place by the fastening roller 49. Therefore, the portion of the microcapsule-coated sheet 24 which is placed on and upstream of the exposure table 25 is not affected by changes in the tension of the microcapsule-coated sheet 24 downstream of the exposure table 25.

When it is desired to reproduce a plurality of color images from the same set of mask members 22, the gate 43 in the mask member feeder 38 is angularly shifted to guide the mask member 22R stored in the storage tray 41 into the positioning unit 39 again, and the microcapsule-coated sheet 24 is exposed to light through the mask member 22R. The mask member 22G, 22B are similarly guided from the storage trays 42, 41 successively into the positioning unit 39 as soon as the exposure cycle using the previous mask member 22 is finished. The mask member feeder 38 can thus repeatedly circulate the mask members 22 as many times as desired.

After a desired number of color images have been reproduced from the same set of mask members 22, the gate 43 is further angularly shifted to discharge the mask members 22 from the mask member feeder 38 into the discharge tray 44.

If a mask member 22' of another set is eventually fed from the laser printer 1 while a series of color images are being reproduced in the color image forming apparatus 20, then the gate 43 is angularly moved to guide the mask member 22' from the laser printer 1 into the discharge tray 44.

The mask member feeder 38 is associated with the manual feed tray 31 for allowing a mask member 22, which has been produced by another means, to be manually introduced into the color image forming apparatus 20. A manual feed gate is provided to prevent a mask member from being manually inserted in the event that there has already been another mask member in the mask member feeder 38.

The mask members 22 generated by the laser printer 1 or manually inserted from the manual feed tray 31 may not be introduced in the order of mask members of red (R), green (G), and blue (B).

To record subsequent color images, the mask members 22 are successively supplied from the storage trays 41, 42 into the positioning unit 39. At this time, one of the mask members 22 which corresponds to the filter positioned below the lamp 21 is selected and delivered to the positioning unit 39.

Even if the mask members are inserted in any random order or sequence when a plurality of color images are to be recorded from the set of mask members, there is required no time to change the color separation filters depending on the colors of the mask members to be used when the exposure process is carried out to record the second and following color images. As a result, color images can be recorded at a high speed.

Figure 3:
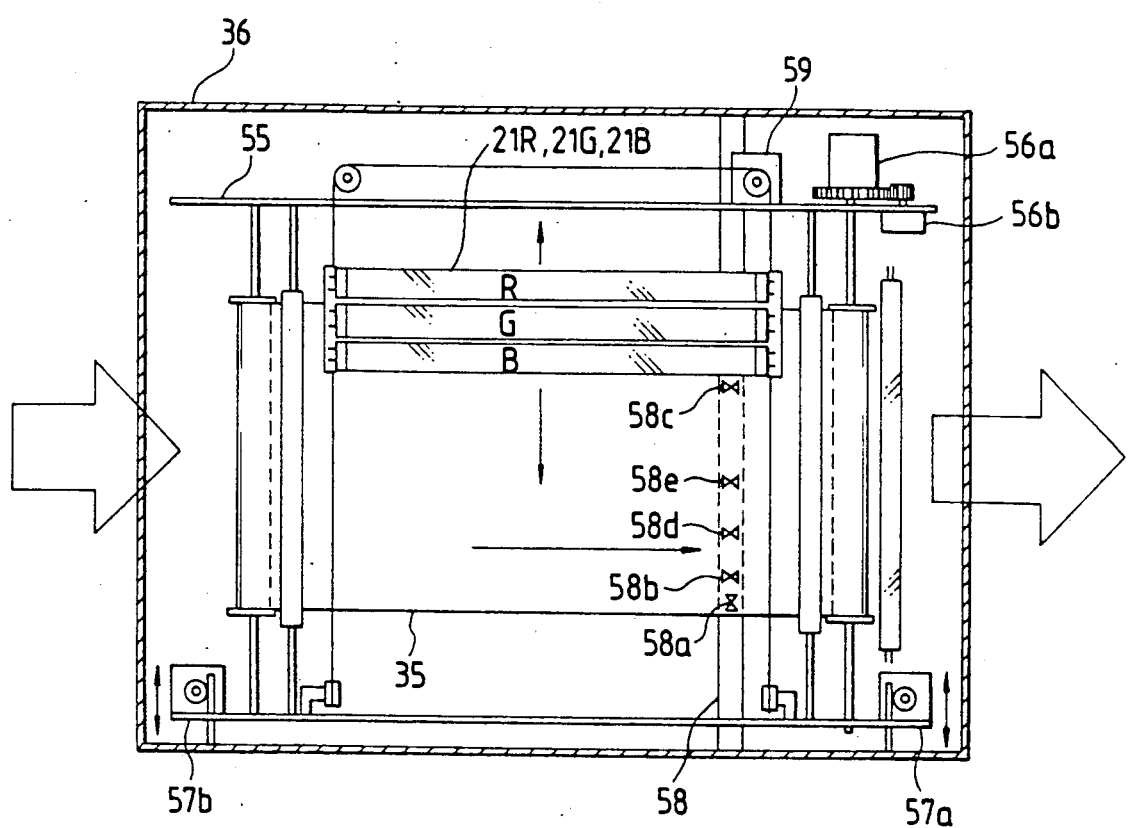
FIG. 3 is a plan view showing an exposure unit.

Next, detailed arrangement of the exposure unit 36 of the apparatus shown in FIG. 1 will be described with reference to FIG. 3.

The exposure unit 36 has a unit frame to which a sensor holder 58 is fixedly secured in a direction perpendicular to the travelling direction of the mask member 22. On the sensor holder 58, various kinds of sensors 58a, 58b, 58c, 58d and 58e are mounted (to be described later). The exposure unit 36 also has a belt roller supporting unit 55 which rotatably supports rollers disposed in spaced-apart relation in the direction in which the mask member 22 is travelled. Between the spaced-apart rollers, the endless conveyor belt 35 is suspended. The exposure unit 36 includes a first belt drive motor 56a for moving the belt 35 at a high speed, and a second belt drive motor 56b for moving the belt 35 at a low speed. It is preferable to employ stepper motors for the first and second belt drive motors 56a, 56b. The exposure unit 36 further includes a third motor 57a, a fourth motor 57b and a fifth motor 59. The third motor 57a and the fourth motor 57b are provided in the downstream side and the upstream side, respectively, with respect to the direction in which the mask member 22 travels. Both the third motor 57a and the fourth motor 57b are provided for moving the roller supporting unit 55 in the widthwise direction of the belt or in the direction perpendicular to the mask member travelling direction. The fifth motor 59 is provided for moving the exposure lamps 21R, 21G, 21B in the direction perpendicular to the mask member travelling direction. Each of the third and fourth motors 57a, 57b is coupled to the belt supporting unit 55 through a combination of rack and pinion.

Figure 4:
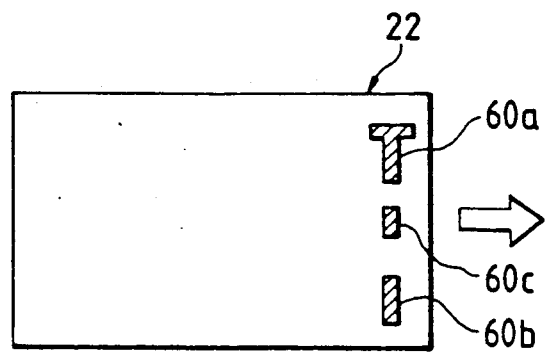
FIG. 4 is a plan view showing a mask member.

Next, the mask member 22 will be described with reference to FIG. 4.

The mask member 22 has a non-image area at the leading edge portion thereof, in the lower surface of which a T-shaped positioning mark 60a, a rectangular-shaped positioning mark 60b and a density information mark 60c are printed. The positioning marks 60a, 60b are printed by the laser printer 1 at the same time when the light shielding image is formed on the image area of the mask member 22. Therefore, the positioning marks 60a, 60b are located in a predetermined relation to the image area. The density information mark 60c is also printed at the same time when the light shielding image is formed on the image area of the mask member 22. The density information mark 60c is defined with a black solid region printed with toner powder all over the region. Therefore, the density information mark 60c represents a density of the light shielding image on the image area, which changes depending upon the operating condition of the laser printer 1.

Referring back to FIG. 3, the sensor 58a which may be a reflection type photoelectric sensor senses the positioning mark oriented in the direction perpendicular to the mask member travelling direction. The sensors 58b, 58c which may also be reflection type photoelectric sensors sense the position marks oriented in the mask member travelling direction. The sensor 58d senses a light transmission rate in the density information mark 60c. The sensor 58e senses a light transmission rate in the mask member 22 in the non-image area where no image or no mark is printed.

Figure 5:
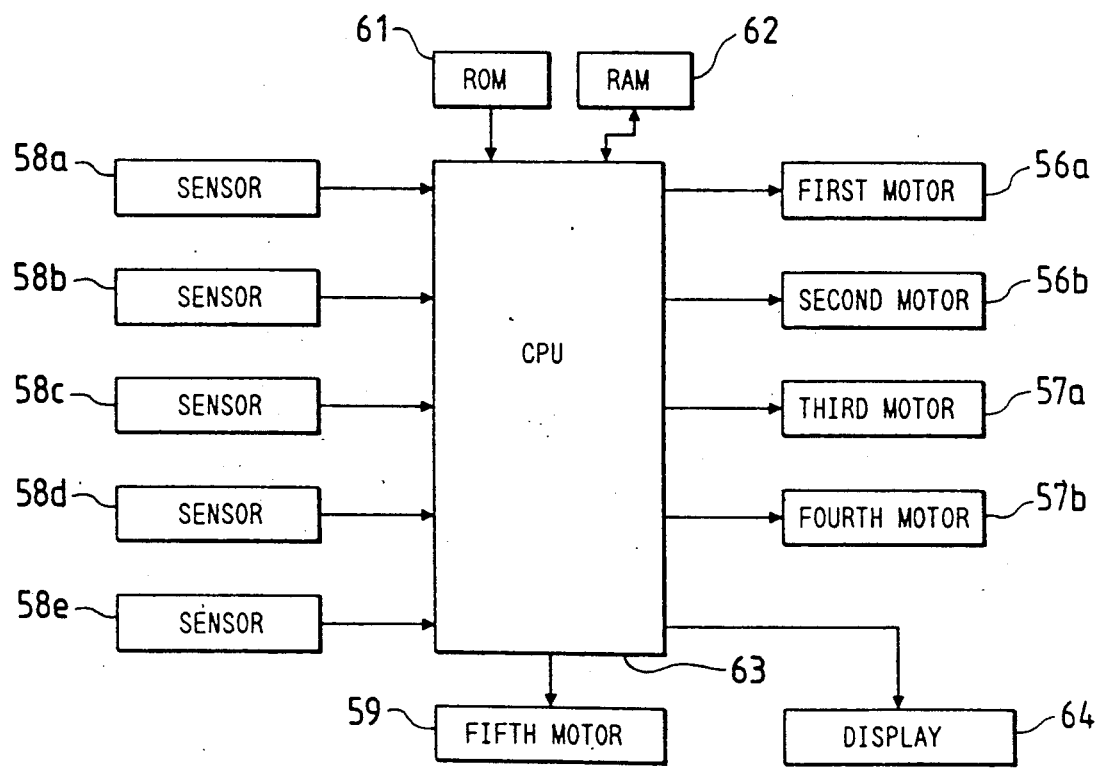
FIG. 5 is a block diagram for controlling the exposure unit.

FIG. 5 is a block diagram showing a control unit for controlling an amount of light to be exposed by the exposure lamp. As shown therein, the control unit includes a central processing unit 63, a read-only memory (ROM) 61, and a random access memory (RAM) 62. The latter two memories 61, 62 are connected to the CPU 63. Further connected to the CPU 63 are the sensors 58a through 58e. The CPU 63 receives the outputs from those sensors. In response to the outputs from the sensors 58a, 58b and 58c, the CPU 63 initiates processing in accordance with a program stored in the ROM 61 to thereby covey the mask member 22 in the travelling direction upon driving the first and second motors 56a, 56b and adjusting the mask member 22 in the direction perpendicular to the travelling direction upon driving the third and fourth motors 57a, 57b. In further response to the output from the sensors 58d and 58e, the amount of light emitted from the exposure lamp 21 is controlled.

The fifth motor 59 is driven in response to the output from the CPU 50, and the exposure lamps 21R, 21G, 21B are moved at an appropriate speed in the widthwise direction of the belt 35.

A display unit 64 which may be comprised of a liquid crystal display (LCD) is also connected to the CPU 63 and is used for displaying various kinds of help messages or for alerting the operator to the status of the mask member 22.

Figure 6:
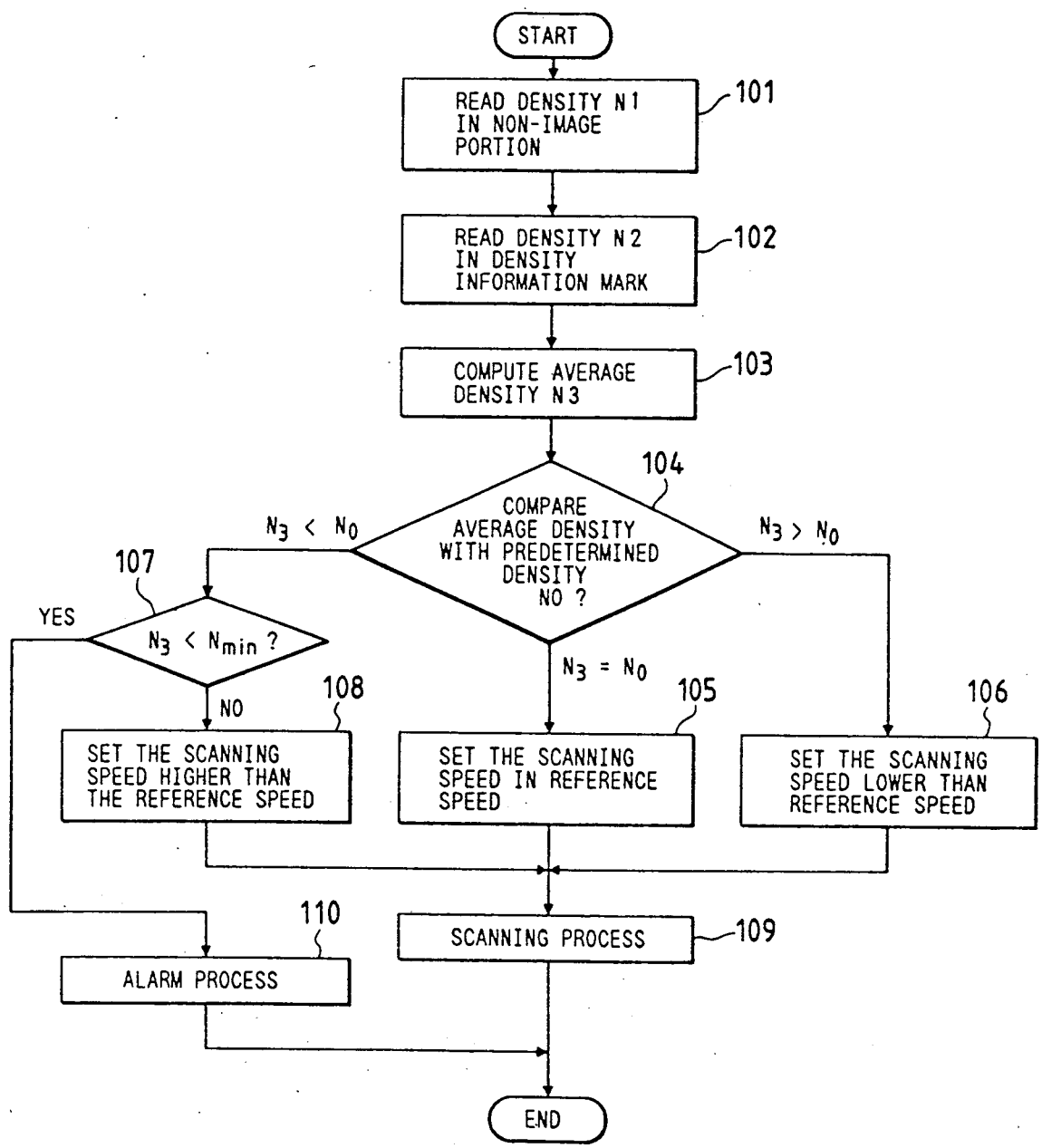
FIG. 6 is a flowchart for description of operational sequence for the exposure process.

FIG. 6 is a flowchart for description of the operation sequence executed by the CPU 63 for controlling the amount of light emitted from the exposure lamp 21. Referring to the flowchart, description will be made with respect to the exposure process executed for the exposure lamp 21R.

When the exposure process starts, the CPU 63 reads the density $N_1$ in the non-image portion of the mask member 22 in response to the output from the sensor 58e and the density $N_2$ in the density information mark 60c in response to the output from the sensor 58d (steps 101 and 102). Upon reading the densities $N_1$ and $N_2$, the CPU 63 performs arithmetic operation to provide an average density $N_3$ of the densities $N_1$ and $N_2$ (step 103). Thereafter, the thus computed average density $N_3$ is compared with a predetermined density level $N_0$ (step 104).

When the predetermined density level $N_0$ is equal to the average density $N_3$, the exposure lamp 21R is scanned at a predetermined reference speed (step 105). If the predetermined density level $N_0$ is lower than the average density $N_3$, the exposure lamp 21R is scanned at a speed lower by a certain value than the reference speed (step 106). If, on the other hand, the predetermined density level $N_0$ is higher than the average density $N_3$, further decision is made as to whether or not the average density $N_3$ is smaller than a predetermined minimum $N_{min}$ (step 107). If the decision made in step 107 is NO, i.e. in the case where the average density $N_3$ is larger than the predetermined minimum $N_{min}$, the exposure lamp 21R is scanned at a speed higher by a certain value than the reference speed (step 108).

After the scanning speed of the exposure lamp 21R is so determined, the exposure lamp 21R is moved in the direction perpendicular to the mask travelling direction by the fifth motor 59 (step 109).

When the decision made in step 107 is YES, i.e., in the case where the average density $N_3$ is smaller than the predetermined minimum $N_{min}$, an alarm process is executed (step 110) to display an alarm message on the display unit 64 for informing the operator of the defect of the mask member 22R.

According to the above-described embodiment, in the case where the light shielding image formed on the mask member 22 is light in density due to the conditions of the photosensitive drum 3 and/or the developing unit 4, the average density $N_3$ is lower than the predetermined density level $N_0$. In such a case, the scanning speed of the exposure lamp 21 is made faster than the reference speed, so that an amount of light irradiated onto the mask member 22 is reduced. Hence, the microcapsules beneath the light shielding area of the mask member 22 are not exposed to light.

In the case where the light transmission rate of the the mask member region on which no light shielding images exist is lower than the predetermined level due to the paper quality and/or paper thickness, the average density $N_3$ is higher than the predetermined density level $N_0$. In such a case, the scanning speed of the exposure lamp 21 is made slower than the reference speed to thereby increase the amount of exposure. As a result, the microcapsules in that region are photo-cured.

In this manner, based on the average density $N_3$ of the densities $N_1$ and $N_2$, the moving speed of the exposure lamp 21R is controlled, so that an optimum amount of light is irradiated onto the mask member 22R independently of the thickness and the paper quality of the mask member 22 and the density of the toner image. Hence, a latent image corresponding to the pattern of the light shielding image on the mask member 22 is formed on the microcapsule-coated sheet 24.

Figure 7:
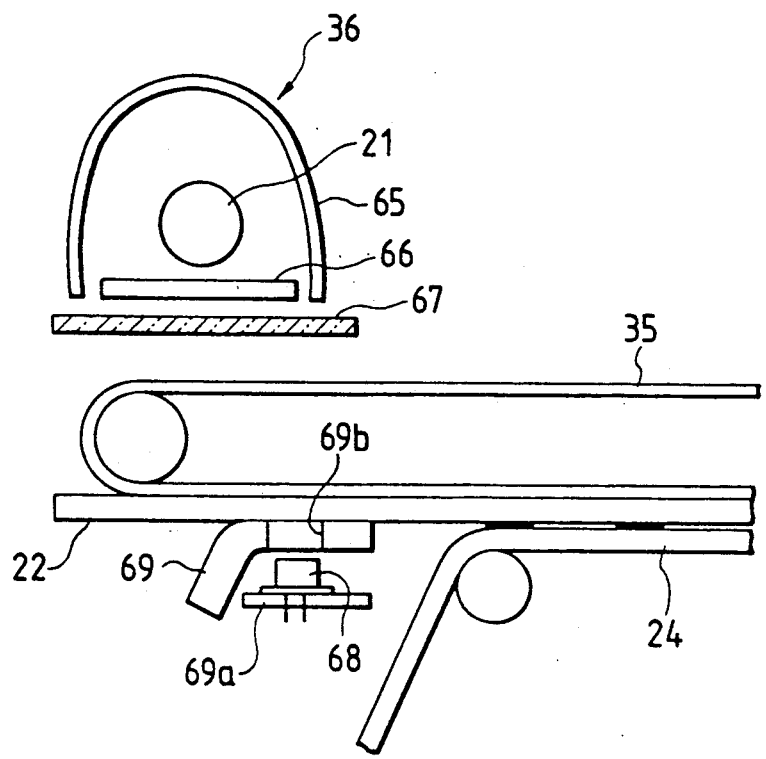
FIG. 7 is an enlarged vertical cross-sectional view showing a part of the image recording apparatus.

Referring next to FIG. 7, the exposure unit 36 according to one embodiment of the invention will be described.

As shown in FIG. 7, the exposure unit 36 includes an exposure lamp 21, a dome-shaped reflector 65, a glass plate 66 and a filter 67. The reflector 65 is disposed to surround the lamp 21. The glass plate 66 is disposed immediately below the lamp 21 and the filter 67 is disposed below the glass plate 66. In the position where the exposure unit 36 is moved rightwardly from the position depicted in the drawing, the light emitted from the lamp 21 and reflected from the inner surface of the dome-shaped reflector 65 is passed through the glass plate 67, the filter 66, the transparent conveyor belt 35 and the mask member 22, and is then applied to the microcapsule-coated sheet 24 for exposure.

Beneath the exposure unit 36, an optical sensor 68 is provided capable of sensing an amount of light emitted from the exposure lamp 21. The optical sensor 68 is mounted on a base plate 69a so that the sensing surface thereof is oriented upwardly. Immediately below the mask member 22 and above the optical sensor 68, a timber 69 is provided for positioning the sensor 68. A through-hole 69b is formed in the timber 69 through which the light emitted from the exposure lamp 21 is received at the sensor 68.

Figure 8:
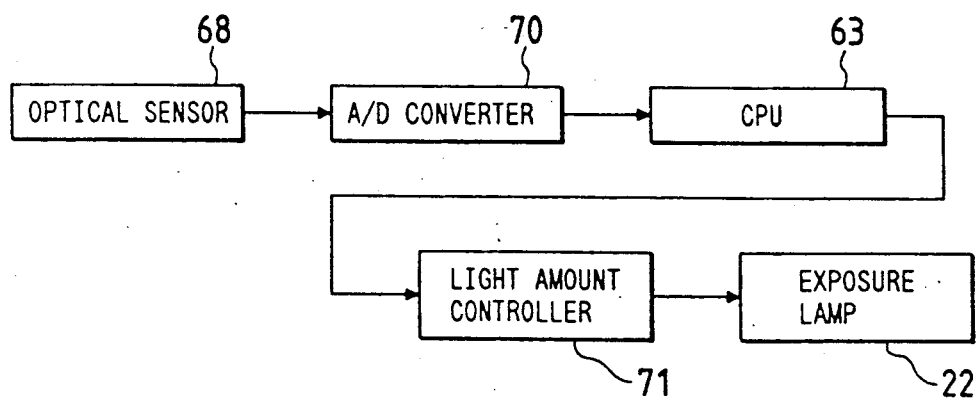
FIG. 8 is a block diagram for controlling the exposure unit.

The sensor 68 is so disposed that the amount of light applied to the microcapsule-coated sheet 24 can be measured thereby. The optical sensor 68 outputs an electrical signal corresponding to the amount of light received. As shown in FIG. 8, the signal is applied to an analog-to-digital (A/D) converter 70 where the signal is subjected to analog-to-digital conversion, and the resultant digital signal is applied to the CPU 63. The CPU 63 implements processing to determine the intensity of light emitted from the exposure lamp 21 and/or a duration of the exposure by the exposure lamp 21 in response to the input signal. Hence, the CPU 63 outputs a signal indicative of the intensity of exposure light or the duration of the exposure, or both. The output signal from the CPU 63 is fed back through a light amount controller 71 to the exposure lamp 21 to control at least one of the light intensity and the exposure duration. Although not shown in FIG. 8, a light amount monitoring circuit may be incorporated into the circuit of FIG. 8 to thereby produce an error signal when the amount of light sensed in the optical sensor 68 exceeds a predetermined value.

Figure 9:
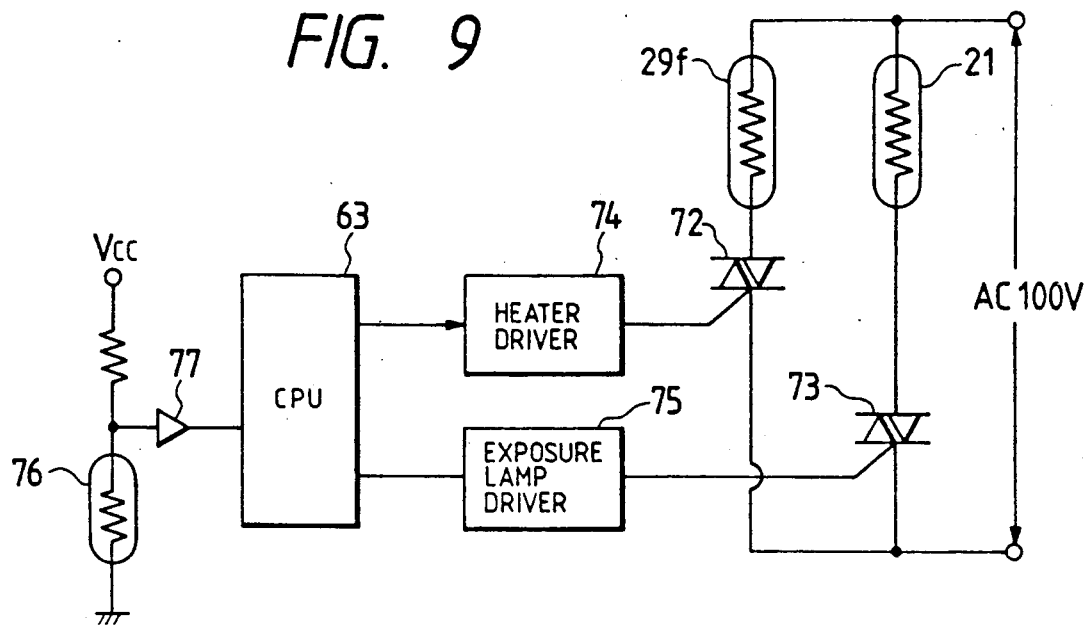
FIG. 9 is a block diagram showing a heater control system.
Figure 10:
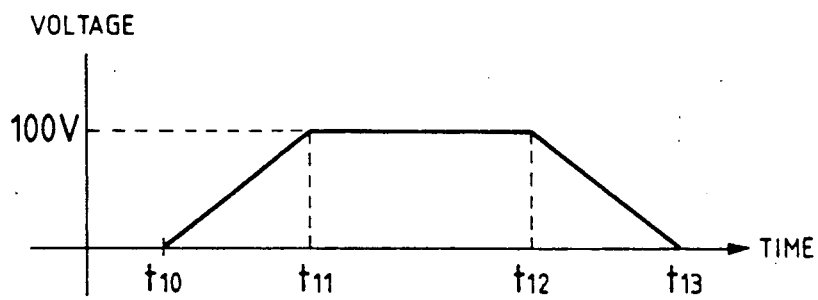
FIG. 10 is a diagram showing a relation between time and voltage.

FIG. 9 is a block diagram showing a heater controlling system for controlling a heater incorporated in the thermal fixing unit 29. Although not indicated in FIGS. 1 and 2, the thermal fixing unit 29 includes the heater 29$f$. The heater 29$f$ and the exposure lamp 21 are connected to a common power supply so that when the conduction to the heater 29$f$ of the thermal fixing unit 29 is instantaneously switched to on or off, the power source voltage fluctuates and this causes a change in the intensity of the light emitted from the exposure lamp 21. If the light intensity changes, the density of the image formed on the developer sheet 26 varies, thereby degrading the image quality reproduced on the developer sheet 26.

In order to solve the above-mentioned drawback, the circuit shown in FIG. 9 is provided in which a serial connection of the heater 29$f$ and a first triac 72 and another serial connection of the exposure lamp 21 and a second triac 73 are connected in parallel across a common AC power supply (AC 100 volts). The temperature of the heater 29$f$ is sensed by a thermister 76 and the sensed output is applied to a buffer amplifier 77. Depending upon a threshold value of the buffer amplifier 77, the output level from the buffer amplifier 77 is determined. The output from the buffer amplifier 77 is applied to the CPU 63 (the same as that shown in FIGS. 5 and 8). The CPU 63 compares the sensed temperature indicated by the input signal with a reference value, and outputs to a heater driver 74 a signal indicative of the difference between the sensed temperature of the heater 29$f$ and the reference value. In response thereto, the heater driver 74 triggers the triac 72 so that the latter performs on-off switchings with respect to the conduction of the AC power supply to the heater 29$f$. Thus, the conduction to the heater 29$f$ is controlled depending upon the temperature of the heater 29$f$. On the other hand, an exposure lamp driver 75 is connected to the output of the CPU 63 and the driver 75 triggers the second triac 73 in response to an exposure instruction supplied from the CPU 63 to thus control the lighting of the exposure lamp 21.

Figure 11:
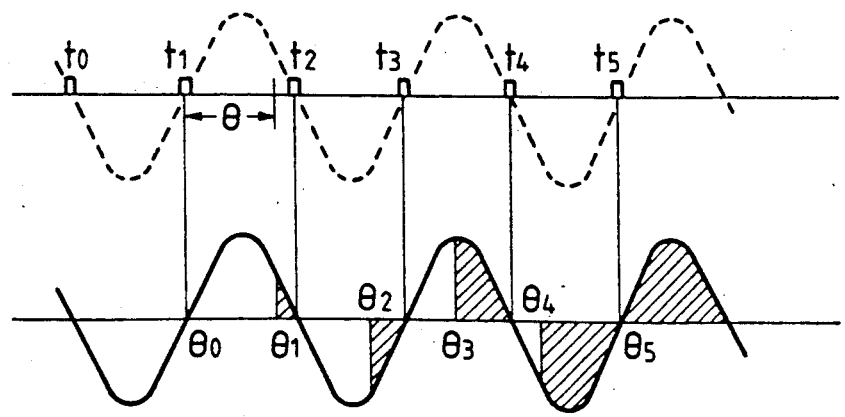
FIG. 11 is a waveform diagram for description of a phase control.
Figure 12:
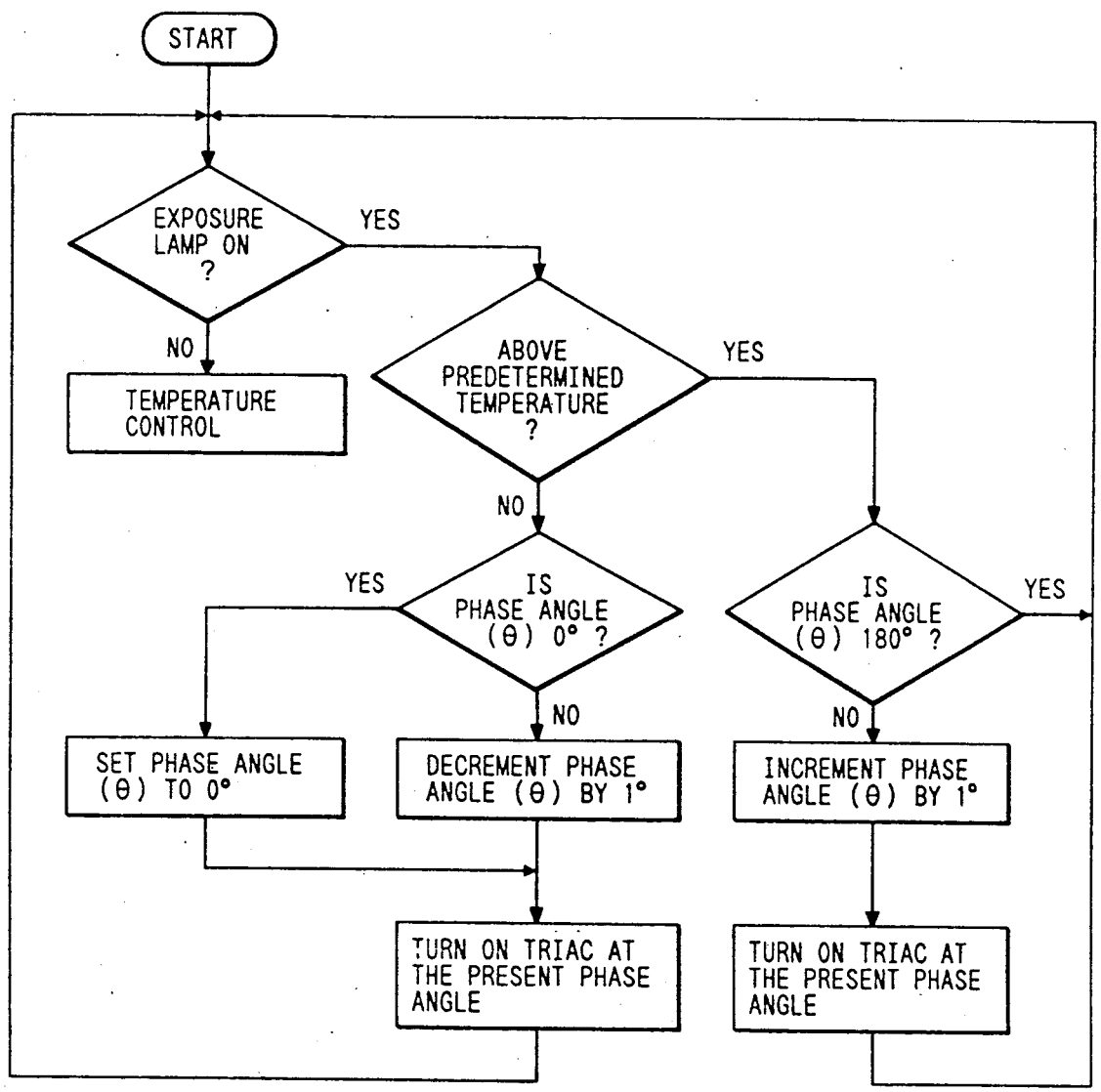
FIG. 12 is a flowchart for description of operational sequence performed by the circuit shown in FIG. 9.

As shown in the flowchart of FIG. 12, when the CPU 63 determines that the temperature of the heater 29$f$ is below a predetermined value under the condition where the exposure lamp 21 is being lit under the condition where the heater 29$f$ is continuously being supplied with power, i.e., under 100% conductive state or the state where the phase angle $\theta$ is equal to 0 (zero) degree, the supply of the power to the heater 29$f$ is remained unchanged. If the phase angle $\theta$ is not equal to 0 (zero) degree, the triac 72 is triggered so that the phase angle $\theta$ is decremented by 1 (one) degree at every predetermined interval. Accordingly, the conduction period of time during which the heater 29$f$ is being supplied with power gradually increases as shown in FIG. 11. By such a control, an amount of power applied to the heater 29$f$ macroscopically changes as depicted by oblique lines in FIG. 11. As a result, the voltage fluctuation of the AC power supply can be suppressed. The phase angle $\theta$ can be decremented from 180 degrees at maximum (corresponding to $\theta_0$ at time instant $t_0$ at which no AC voltage wave is available; see FIG. 11) to 0 (zero) degree at minimum (corresponding to $\theta_5$ at time instant $t_5$ as shown in FIG. 11). After the phase angle $\theta$ becomes equal to 0 (zero) degree, this condition will be maintained.

On the other hand, when the CPU determines that the temperature of the heater 29$f$ is above the predetermined value during light of the exposure lamp 21 and if, under this condition, the heater 29$f$ has not been supplied with power from the AC power supply, i.e., the phase angle $\theta$ is being equal to 180 degrees, this condition will be maintained as it is. When the firing angle $\theta$ is not equal to 180 degrees, the firing angle $\theta$ is incremented by 1 (one) degree at every predetermined time interval to thereby trigger the triac 72 so that the conduction period of time during which the heater 29$f$ is being supplied with power is gradually decreased. By such a control, an amount of power applied to the heater 29$f$ changes as a whole as can be understood from FIG. 11. As a result, the voltage fluctuation of the AC power supply can be reduced.

When the temperature of the heater 29$f$ has exceeded the predetermined temperature in the process of decrementing the firing angle, the routine of the flowchart proceeds to a step for incrementing the firing angle. On the other hand, when the temperature of the heater 29$f$ falls below the predetermined temperature in the process of incrementing the firing angle, the routine of the flowchart proceeds to a step for decrementing the firing angle.

Figure 13:
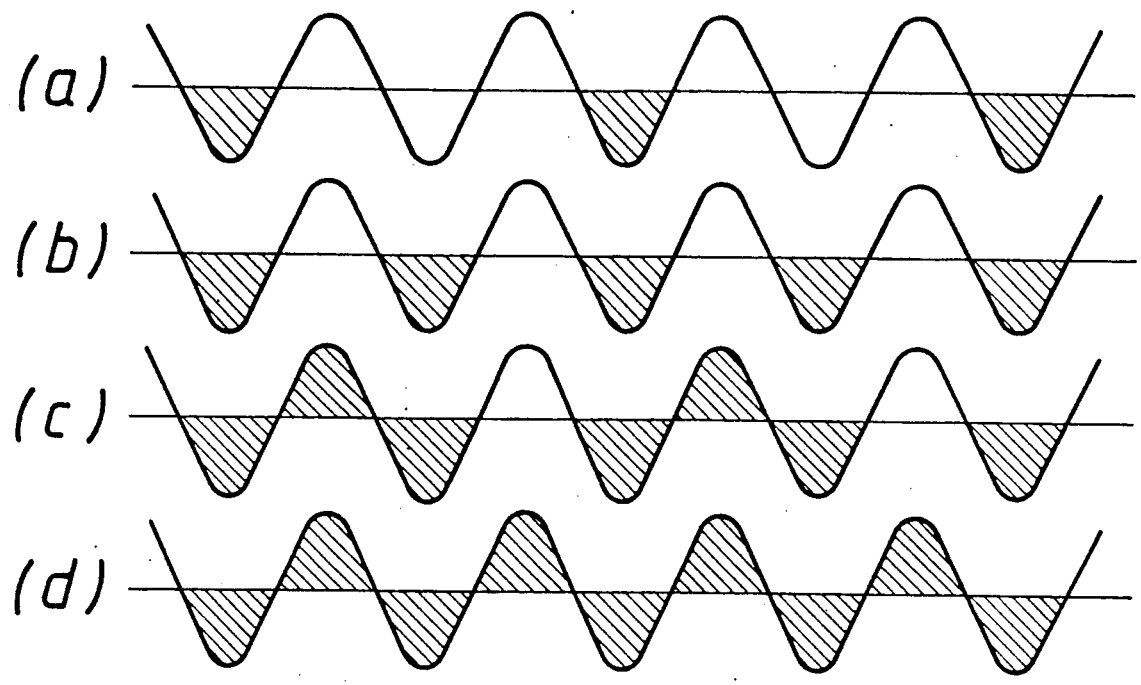
FIG. 13 is a waveform diagram for description of the operation of the circuit shown in FIG. 9.

For gradually decreasing the amount of power supplied to the heater 29$f$, the power supply may be controlled as illustrated in FIG. 13. Specifically, the heater 29$f$ changes in the order of a, b, c and d or in the reverse order. In the state of a in FIG. 13, power is supplied every three-half cycles. In the state of b, power is supplied every other half-cycle. In the state of c, power is supplied continuously during three-half cycles with subsequent one-half cycle interruption. In the state of d, power is continuously supplied.

As described, since an amount of power supplied to the heater 29$f$ is controlled so as to be gradually increased or decreased depending upon the temperature of the heater 29$f$, the voltage fluctuation of the power supply common to the heater 29$f$ and the exposure lamp 21 can be reduced. Hence, the variation of light energy applied to the microcapsule-coated sheet 24 can be reduced, and the variation in the density of the image formed on the developer sheet 26 can be reduced.

In order to apply a constant amount of light energy to the microcapsule-coated sheet 24, the amount of light emitted from the exposure lamp 21 has heretofore been detected with the use of an optical sensor, and the amount of light emitted from the exposure lamp 21 has been controlled by delaying the phase of the AC voltage connected to the exposure lamp 21. However, it takes considerably long time to adjust the amount of light to a desired value. In order to resolve such a problem, there is provided an exposure control device as shown in FIG. 14.

Figure 14:
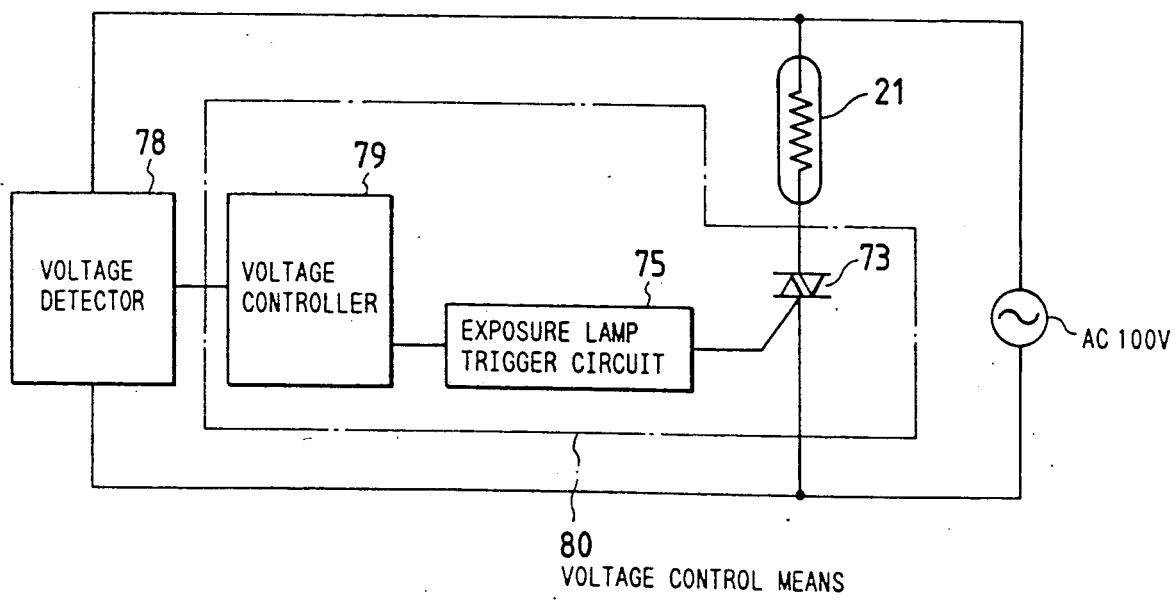
FIG. 14 is a block diagram showing an exposure lamp control system.

As shown in FIG. 14, a series connection of the exposure lamp 21 and the triac 73 is connected across the AC power supply (AC 100 volts). A voltage detector 78, which may be a mean value voltage detector, is also connected across the AC power supply for detecting the voltage developed by the AC power supply.

Figures 15, 16:
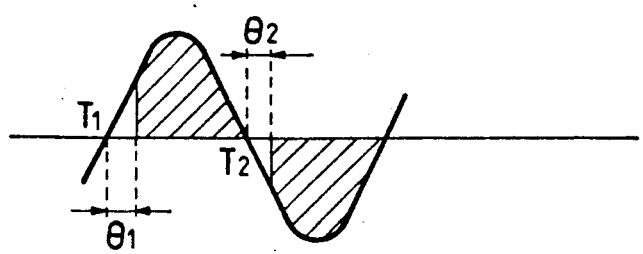
FIG. 15 is a waveform diagram for description of a phase control.
FIG. 16 is a table indicating a relation between detected voltages and firing angles.

A voltage controller 79 is connected to the voltage detector 78 and the voltage detected by the voltage detector 78 is inputted to the voltage controller 79. In response to the input from the voltage detector 78, the voltage controller 79 outputs a voltage control signal while referring to a table as indicated in FIG. 16. The table indicated in FIG. 16 contains firing angles corresponding to the power supply voltages detected by the voltage detector 78. Such a table has been stored in a ROM (not shown) contained in the voltage controller 79. The firing angle is defined by an angle between a zero-cross point to the subsequent voltage application commencing point as can be clearly understood from FIG. 15. Specifically, the AC voltage is applied to the exposure lamp 21 during a period of time as indicated by oblique lines in FIG. 15. The firing angles in relation to the power supply voltages have been determined so that the voltages applied to the exposure lamp 21 are at a desired constant value independently of the variation of the power supply voltage. Such firing angles can be obtained theoretically or based on experience.

An exposure lamp trigger circuit or driver 75 is connected between the voltage controller 79 and the gate of the triac 73. The exposure lamp trigger circuit 75 outputs a trigger signal for rendering the triac 73 conductive and non-conductive in response to a voltage control signal outputted from the voltage controller 79. By the ON-OFF switching performed by the triac 73, the voltage applied to the exposure lamp 21 is controlled at constant. As shown in FIG. 15, the triac 73 is rendered conductive after a certain period time has elapsed corresponding to the firing angle $\theta_1$ from the zero-cross point T1. The triac 73 is rendered non-conductive during a period of time corresponding to the firing angle $\theta_2$ and is again rendered conductive until the subsequent zero-cross point. A voltage control means 80 is comprised of the voltage controller 79, exposure lamp trigger circuit 75 and triac 73.

The operation of the circuit in FIG. 14 will next be described.

The voltage detector 78 detects the voltage developed by the AC power supply. Assuming that the voltage detected by the voltage detector 78 is 96 volts, the voltage controller 79 is impressed with this 96 volts. The voltage controller 79 refers the table shown in FIG. 16 and selects the firing angle of 66 degrees corresponding to 96 volts. Then, the voltage controller 79 applies a signal indicative of 66 degrees to the exposure lamp trigger circuit 75. The latter circuit issues a trigger signal to the triac 73 in response to the signal supplied from the voltage controller 79. The triac 73 is rendered conductive with the firing angle of 66 degrees, and thus the voltage applied to the exposure lamp 21 is maintained substantially constant and a desired amount of light is emitted from the exposure lamp 21 even if the power supply voltage is 96 volts which is lower than 100 volts.

Next, when the voltage developed by the AC power supply changes from 96 volts to 105 volts, the voltage detector 78 detects 105 volts and the voltage controller 79 is impressed with 105 volts. The voltage controller 79 refers to the table shown in FIG. 16 and selects the firing angle of 78 degrees corresponding to the power supply voltage of 105 volts. The voltage controller 79 issues a signal indicative of 78 degrees to the triac 73 which in turn is rendered conductive with the phase of 78 degrees. Thus, the voltage applied to the exposure lamp 21 is maintained at the desired constant value. Specifically, although the power supply voltage has been increased from 96 volts to 105 volts, the firing angle has been increased from 66 degrees to 78 degrees. By the balance of the power supply voltage and the firing angle, the voltage applied to the load is maintained at constant. Therefore, the amount of light emitted from the exposure lamp 21 is quickly stablized even if the power supply voltage fluctuates.

Figure 17:
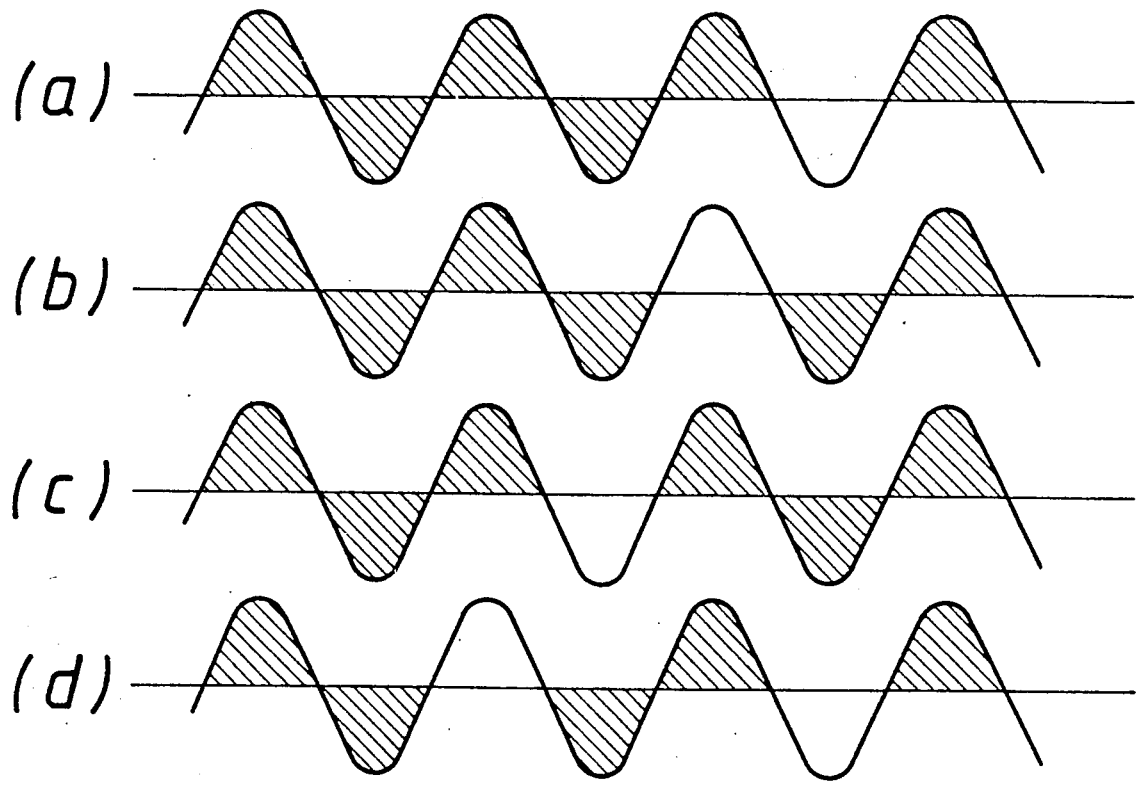
FIG. 17 is a waveform diagram for description of the operation of the circuit shown in FIG. 14.

The voltage applied to the exposure lamp 21 may be controlled by interrupting the application of the power supply voltage for a half-cycle every predetermined number of half-cycles (FIG. 17).

Although the various types of exposure controls have been described, it should be understood that these exposure controls can be used either alone or in a combination of two or more than two controls.

Although the present invention has been described with respect to specific embodiments, it would be apparent for those skilled in the art that various changes and modifications may be made without departing from the scope and spirit of the invention.

What is claimed is:

1. An image recording apparatus for recording on a photosensitive recording medium an image corresponding to an original image using at least one mask member having a surface on which a light shielding image corresponding to the original image is formed with a light shielding material, wherein the mask member coated with the light shielding material has a first light transmission rate and the mask member with no light shielding material has a second light transmission rate, the apparatus comprising:

exposure means for exposing the photosensitive recording medium to light through the mask member to form a latent image corresponding to the light shielding image on the photosensitive recording medium, said exposure means including an exposure lamp for emitting a light;

developing means for developing the latent image formed on the photosensitive recording medium to provide a visible image;

fixing means for thermally fixing the visible image, said fixing means including a heat generating element;

first detecting means for detecting the first light transmission rate and producing a first signal indicative of the first light transmission rate;

second detecting means for detecting the second light transmission rate and producing a second signal indicative of the second light transmission rate;

control means responsive to both the first signal and the second signal for controlling an amount of light applied to the photosensitive recording medium by said exposure means.

2. An image recording apparatus according to claim 1, further comprising third detecting means for detecting a voltage applied to said exposure lamp and producing a third signal indicative of said voltage to a voltage control means, said voltage control means further controls the intensity of the light emitted from said exposure lamp in response to the third signal.

3. An image recording apparatus according to claim 1, further comprising third detecting means for detecting an amount of light emitted from said exposure lamp and producing a third signal indicative of the amount of light, and wherein said control means further controls the time duration during which said exposure lamp emits the light in further response to the third signal.

4. An image recording apparatus according to claim 3, wherein said control means controls the intensity of the light emitted from said exposure lamp in response to the third signal.

5. An image recording apparatus according to claim 1, further comprising:
an AC power supply having two terminals, said exposure lamp and said heat generating element being connected in parallel across the two terminals;
first switching means interposed between said AC power supply and said exposure lamp for on/off switching the connection of said exposure lamp to said AC power supply;
second switching means interposed between said AC power supply and said heat generating element for on/off switching the connection of said heat generating element to said AC power supply;
temperature sensing means for sensing a temperature of said heat generating element and outputting a temperature signal indicative of the sensed temperature; and
wherein said control means is connected to said temperature sensing means for controlling the switchings of said second switching means in response to the signal indicative of the sensed temperature.

6. An image recording apparatus according to claim 1, further comprising:
an AC power supply having two terminals, said exposure lamp and said heat generating element being connected in parallel across the two terminals;
voltage detecting means for detecting a voltage across the two terminals of said AC power supply and outputting a voltage signal indicative of the detected voltage; and
a second control means for controlling the AC voltage applied to said exposure lamp so that a power supplied to said exposure lamp is held substantially constant.

7. An image recording apparatus according to claim 6, wherein said second control means includes a switching element for performing on/off switching actions in response to the voltage signal.

8. An image recording apparatus for recording an image on a photosensitive recording medium, comprising:
exposure means for exposing the photosensitive recording medium to light to form a latent image thereon, said exposure means including an exposure lamp for emitting a light;
developing means for developing the latent image formed on the photosensitive recording medium to provide a visible image;
fixing means for thermally fixing the visible image, said fixing means including a heat generating element;
first detecting means for detecting an intensity of the light emitted from said exposure lamp and producing a first signal indicative of the intensity of the light;
control means responsive to the signal produced from said detecting means for controlling the intensity of the light emitted from said exposure lamp;
an AC power supply having two terminals, said exposure lamp and said heat generating element being connected in parallel across the two terminals;
first switching means interposed between said AC power supply and said exposure lamp for on/off switching the connection of said exposure lamp to said AC power supply;
second switching means interposed between said AC power supply and said heat generating element for on/off switching the connection of said heat generating element to said AC power supply;
temperature sensing means for sensing a temperature of said heat generating element and outputting a temperature signal indicative of the sensed temperature; and
wherein said control means is connected to said temperature sensing means for controlling the switchings of said second switching means in response to the signal indicative of the sensed temperature.

9. An image recording apparatus according to claim 8, further comprising:
a second control means; and
a second detecting means for indirectly detecting by means of a voltage detector an amount of light emitted from said exposure lamp and producing a second signal indirectly indicative by means of a voltage detected of the amount of light, wherein said second control means controls discrete periods of time during which said exposure lamp emits the light in further response to said second signal.

10. An image recording apparatus according to claim 9, wherein said second control means controls the intensity of the light emitted from said exposure lamp in response to the second signal.

11. An image recording apparatus according to claim 8, further comprising:
voltage detecting means for detecting a voltage across the two terminals of said AC power supply and outputting a voltage signal indicative of the detected voltage; and
a second control means, wherein said second control means controls the AC voltage applied to said exposure lamp so that a power supply to said exposure lamp is held substantially constant.

12. An image recording apparatus according to claim 11, wherein said second control means includes a switching element for performing on/off switching actions in response to the voltage signal.

13. An image recording apparatus for recording an image on a photosensitive recording medium, comprising:
exposure means for exposing the photosensitive recording medium to light to form a latent image thereon, said exposure means including an exposure lamp for emitting a light;
developing means for developing the latent image formed on the photosensitive recording medium to provide a visible image;
fixing means for thermally fixing the visible image, said fixing means including a heat generating element;
first detecting means for detecting an amount of light emitted from said exposure lamp and producing a first signal indicative of the intensity of the light;
control means responsive to the signal produced from said first detecting means for controlling a period of time during which said exposure lamp emits the light;
an AC power supply having two terminals, said exposure lamp and said heat generating element being connected in parallel across the two terminals;

first switching means interposed between said AC power supply and said exposure lamp for on/off switching the connection of said exposure lamp to said AC power supply;

second switching means interposed between said AC power supply and said heat generating element for on/off switching the connection of said heat generating element to said AC power supply;

temperature sensing means for sensing a temperature of said heat generating element and outputting a temperature signal indicative of the sensed temperature; and wherein said control means is connected to said temperature sensing means for controlling the switchings of said second switching means in response to the signal indicative of the sensed temperature.

14. An image recording apparatus according to claim 13, wherein said control means controls the intensity of the light emitted from said exposure lamp in response to the first signal.

15. An image recording apparatus according to claim 13, further comprising:

voltage detecting means for detecting a voltage across the two terminals of said AC power supply and outputting a voltage signal indicative of the detected voltage; and a second control means, wherein said second control means controls the AC voltage applied to said exposure lamp so that a power supply to said exposure lamp is held substantially constant.

16. An image recording apparatus according to claim 15, wherein said second control means includes a switching element for performing on/off switching actions in response to the voltage signal.

17. An image recording apparatus according to claim 13, further comprising second detecting means for detecting an intensity of the light emitted from said exposure lamp and producing a second signal indicative of the intensity of the light, wherein said control means controls the intensity of the light emitted from said exposure lamp responsive further to the second signal produced from said second detecting means.

18. An image recording apparatus for recording an image on a photosensitive recording medium, comprising:

an AC power supply;

an exposure means for exposing the photosensitive recording medium to light to form a latent image thereon, said exposure means including an exposure lamp connected to said AC power supply;

a developing means for developing the latent image formed on the photosensitive recording medium to provide a visible image;

a fixing means for thermally fixing the visible image, said fixing means including a heat generating element connected to said AC power supply for generating heat;

a first switching means interposed between said AC power supply and said exposure lamp for on/off switching the connection of said exposure lamp to said AC power supply;

a second switching means interposed between said AC power supply and said heat generating element for on/off switching the connection of said heat generating element to said AC power supply;

a temperature sensing means for sensing a temperature of said heat generating element and outputting a signal indicative of the sensed temperature;

a control means connected to said temperature sensing means for controlling the on/off switchings of said second switching means in response to the signal indicative of the sensed temperature;

a second control means; and a voltage detecting means for detecting a voltage across the two terminals of said AC power supply and outputting a voltage signal indicative of the detected voltage, wherein said second control means controls the AC voltage applied to said exposure lamp so that a power supply to said exposure lamp is held substantially constant.

19. An image recording apparatus according to claim 18, wherein said second control means controls said first switching means for performing on/off switching actions in response to the voltage signal.

20. An image recording apparatus for recording an image on a photosensitive recording medium, comprising:

an AC power supply having two terminals for supplying an AC voltage;

exposure means for exposing the photosensitive recording medium to light to form a latent image thereon, said exposure means including an exposure lamp connected across the two terminals of said AC power supply;

developing means for developing the latent image formed on the photosensitive recording medium to provide a visible image;

fixing means for thermally fixing the visible image;

voltage detecting means for detecting a voltage across the two terminals of said AC power supply and outputting a voltage signal; and control means for controlling the AC voltage applied to said exposure lamp, said control means including memory means storing therein a table containing a plurality of combinations of an AC voltage value and a firing angle, and a switching element interposed between said AC power supply and said exposure lamp for performing on/off switching actions, wherein said control means selects a firing angle in association with the voltage indicated by the voltage signal from the table and outputs a trigger signal and said switching element performs the switching actions in response to the trigger signal, so that a power supplied to said exposure lamp is substantially held constant.

21. An image recording apparatus according to claim 20, wherein said switching element is a triac having a trigger terminal supplied with the trigger signal.

* * * * *